United States Patent [19]
Merritt et al.

[11] Patent Number: 5,252,912
[45] Date of Patent: Oct. 12, 1993

[54] SYSTEM FOR WARNING AIRCRAFT PILOT OF POTENTIAL IMPACT WITH A POWER LINE AND GENERATING TIME-TO-TIME IMPACT SIGNAL

[75] Inventors: William E. Merritt, 1431 SE. Knight, Portland, Oreg. 97202; Joel Johnson, Lake Oswego, Oreg.

[73] Assignee: William E. Merritt, Portland, Oreg.

[21] Appl. No.: 711,921

[22] Filed: Jun. 6, 1991

Related U.S. Application Data

[63] Continuation of Ser. No. 478,547, Feb. 12, 1990, abandoned, which is a continuation-in-part of Ser. No. 373,805, Jun. 28, 1989, abandoned.

[51] Int. Cl.$^5$ ............................................. G01R 31/02
[52] U.S. Cl. ..................... 324/72; 73/178 R; 340/903; 364/461; 342/417
[58] Field of Search ............... 324/72, 72.5, 457; 73/178 R; 340/903; 102/212; 364/460, 461, 427; 342/13, 68, 127, 495, 351, 394, 400, 417, 425

[56] References Cited

U.S. PATENT DOCUMENTS

4,199,715  4/1980  Hill ................................. 324/72
4,405,926  9/1983  Potter ........................... 342/455

*Primary Examiner*—Kenneth A. Wieder
*Assistant Examiner*—Glenn W. Brown
*Attorney, Agent, or Firm*—Dellett, Smith-Hill and Walters

[57] ABSTRACT

A detector for use on board an aircraft traveling along a path of movement to detect a power line comprises an antenna for sensing the electric field associated with the power line and producing an electric field signal, and a signal processor for receiving the electric field signal and generating a time-to-impact signal representative of the time for the aircraft to reach the power line if it continues on its path of movement. Sensors are used to determine the direction of the power line.

8 Claims, 7 Drawing Sheets

SYSTEM FOR WARNING AIRCRAFT PILOT OF POTENTIAL IMPACT WITH A POWER LINE AND GENERATING TIME-TO-TIME IMPACT SIGNAL

CROSS-REFERENCE TO RELATED APPLICATION

This is a continuation of co-pending patent application Ser. No. 07/478,547 filed Feb. 12, 1990, now abandoned, which is a continuation-in-part of co-pending patent application Ser. No. 07/373,805 filed Jun. 28, 1989, now abandoned.

BACKGROUND OF THE INVENTION

The present invention relates generally to a system for detecting an electrical power line, and more specifically to an improved detector and method for use on board an aircraft for providing an indication of the time-to-impact with the power line if the aircraft remains on course.

Other devices have been proposed in the past for detecting the distance of a power transmission line or cable. Such devices generally fall within two categories, one being those that detect power lines by sensing the magnetic field associated with a conductor having an alternating current (AC) flowing therethrough, and the other type of device sensing the electric field associated with such power lines. From electromagnetic field theory, it is well known that an infinitely long conductor carrying a current will have an associated magnetic field $\bar{H}$ in a circular pattern concentric about the conductor, and an electric field $\bar{E}$ directed radially away from the conductor. From this, it is apparent that the means for sensing an electric and a magnetic field would be different, as well as the circuitry for interpreting the sensed electric and magnetic fields.

A system and method for detecting the direction of power lines from a helicopter by detecting an alternating magnetic field associated with the power lines is disclosed in U.S. Pat. No. 4,362,992 to Young et al. The magnetic field is detected by two vertical loop antennas, with each antenna defining a planar area and receiving a horizontal component of the magnetic field. The antennas are preferably positioned perpendicular to one another. A signal processor is provided to receive and interpret the magnetic field which is sensed by the vertical pair of antennas, and determines therefrom the direction of the power line emitting the magnetic field relative to the helicopter.

The Young et al power line detector also includes a third loop antenna which defines a horizontal planar area and detects the vertical component of the magnetic field. The detected vertical component is used to determine the magnitude of the magnetic field and to provide an early warning of the presence of power lines when the magnitude exceeds a predetermined level.

The Young et al power line detector compensates for the extraneous magnetic fields from sources other than the power line. For example, the effects of any static magnetic fields surrounding the antennas are cancelled by using three airs of Helmholtz coils. A flux valve is used to cancel the earth's magnetic field, and a latitude selector or attitude data unit compensates for the latitude or attitude of the helicopter. Compensation for local variations in the earth's magnetic field is provided by a unit programmed with known data supplied from tables. Such a cumbersome scheme of multiple compensation inputs renders such a magnetic field detector highly susceptible to errors.

Thus, the Young et al detection system merely indicates the relative direction of a power line from a helicopter, and provides an early warning of the presence of power lines. It does not provide or even suggest such useful outputs as the distance or range of the helicopter from the power line, or the time remaining until the helicopter would impact the power line.

Another magnetometer device for use on board an aircraft to detect the position of a magnetic source, such as a submarine, relative to the aircraft is disclosed in U.S. Pat. No. 4,309,659 to Yoshii. As shown, four magnetometer units A, B, C and D are positioned at the aircraft nose, tail and wing tips, respectively. The magnetometer units measure components of the magnetic field in two and in three mutually perpendicular directions. These components, along with a gyroscope signal, are inputs provided to a signal processor.

Magnetometer systems, such as that of Yoshii, typically detect variations in the earth's magnetic field caused by the presence of large magnetic bodies, such as a submarine. From this variation, the position of the magnetic body is computed relative to the position of the magnetometer system. The signal processor computes the distance, direction, attitude and magnetic moment to locate the magnetic source being sought. Typically, aircraft equipped with magnetometers for determining the location of a magnetic source are flown with wings level, even while making turns, otherwise pitch and roll compensation must be included in the magnetometer system.

Other magnetic field detectors are disclosed in U.S. Pat. Nos. 2,996,663, 3,582,932; 3,909,704; and 3,983,475.

There are a variety of proximity alarms for warning a heavy equipment operator, such as a crane operator, that the boom of the crane is approaching an energized power line. One such device is disclosed in U.S. Pat. No. 3,745,549 to Jepperson et al, which detects the proximity of the power line by detecting the electrostatic field associated therewith. An antenna is mounted to the heavy equipment extremity, such as the boom of a crane, the forks of a forklift truck, or the ladder portion of a ladder truck. A switching and control circuit includes antenna sensitivity controls, test circuitry and alarm circuitry. The alarm may be either a light or an audible signal which merely warns the operator when the equipment extremity enters the electrostatic field associated with an energized power line.

Further useful information is not provided by the Jepperson et al device, such as the direction of the power line relative to the equipment extremity, the distance therefrom, or the time before an impact of the equipment extremity with the power line would occur. The Jepperson et al device also requires calibration. If the sensitivity is adjusted to screen out electrostatic fields from nearby extraneous sources, such as high voltage transmission lines, the danger exists that a lower voltage line in the proximity of the equipment may go undetected. Additionally, such sensitivity controls may become misadjusted due to their being accidentally bumped or to the vibration of the heavy equipment during operation.

A proximity detector for warning the operator of a backhoe that the backhoe bucket is approaching an underground conduit is disclosed in U.S. Pat. No. 3,907,136 to Christides et al. This device detects conduit or pipe by transmitting an oscillating electric signal in the region where the backhoe is working, with such transmitters preferably being located on the backhoe support or stabilizer pads. The transmitters induce a small current in any buried electrically conductive conduit in the region. The induced current is detected by sensors mounted within the bucket teeth. Such transmitters may consume a great deal of electrical power in generating the electric field-inducing current. Also, the range of such transmitters would be limited by their power consumption, and are apparently only useful for detecting power lines or conduits within the immediate vicinity of the transmitters.

Other examples of devices used on heavy equipment to detect the presence of power lines are disclosed in U.S. Pat. Nos. 2,615,969; 3,168,729; 3,833,898; 4,064,997; 4,649,375; 4,675,664; and 4,727,447.

Several types of portable detection devices for locating buried metallic pipes have been proposed, which sense an electromagnetic field emitted from the pipe. U.S. Pat. No. 3,988,663 to Slough et al detects the location and depth of buried metallic pipes which carry AC signals impressed thereon as a result of various industrial activities in the vicinity.

U.S. Pat. No. 3,889,179 to Cutler discloses a portable buried pipe locator. External excitation of the pipe by an external power supply is required to provide an emission source to generate an electric field which is detected by the locator. Such a locator first requires that an external location of the pipe be known and the connection be made. The depth of the buried pipe is computed by a triangulation method using multiple readings in the devices of both Slough et al and Cutler.

Another electromagnetic field detecting device for locating buried pipe is disclosed in U.S. Pat. No. 3,893,025 to Humphreys, which also requires external excitation of the buried pipe. The external excitation is provided by transmitters which impress radio frequency signals upon the buried cable or pipe. Two vertically displaced antennas are used to detect the emitted electric field. The difference in the electric field detected by each antenna and the fixed distance between the antennas are used to determine the depth of the pipe. Other devices for locating buried conductors are disclosed in U.S. Pat. Nos. 4,295,095 and 4,672,321.

Thus, a need exists for an improved apparatus for detecting the presence, range and direction relative to an aircraft of an electric power line, as well as for determining the time remaining for a pilot of the aircraft to make a course correction to avoid an impact with the power line.

SUMMARY OF THE INVENTION

According to the present invention, a detector for use on board an aircraft to detect an electric power line comprises antenna means for sensing the electric field associated with the power line and producing an electric field signal, and signal processing means for receiving the electric field signal and generating a time-to-impact signal representative of the time for the aircraft to reach the power line if it continues on its path of movement.

BRIEF DESCRIPTION OF THE DRAWINGS

For a better understanding of the invention, and to show how the same may be carried into effect, reference will now be made, by way of example, to the accompanying drawings in which:

FIG. 1A is an unscaled perspective view of an aircraft and illustrates an electric field detector embodying the present invention, FIG. 1B illustrates on an enlarged scale a detail of FIG. 1A, FIGS. 2, 3, and 4 are diagrams and graphs illustrating the theory of operation of the present invention, including in FIG. 4 a plot of experimental test data.

DETAILED DESCRIPTION

Figures 1A, 1B:
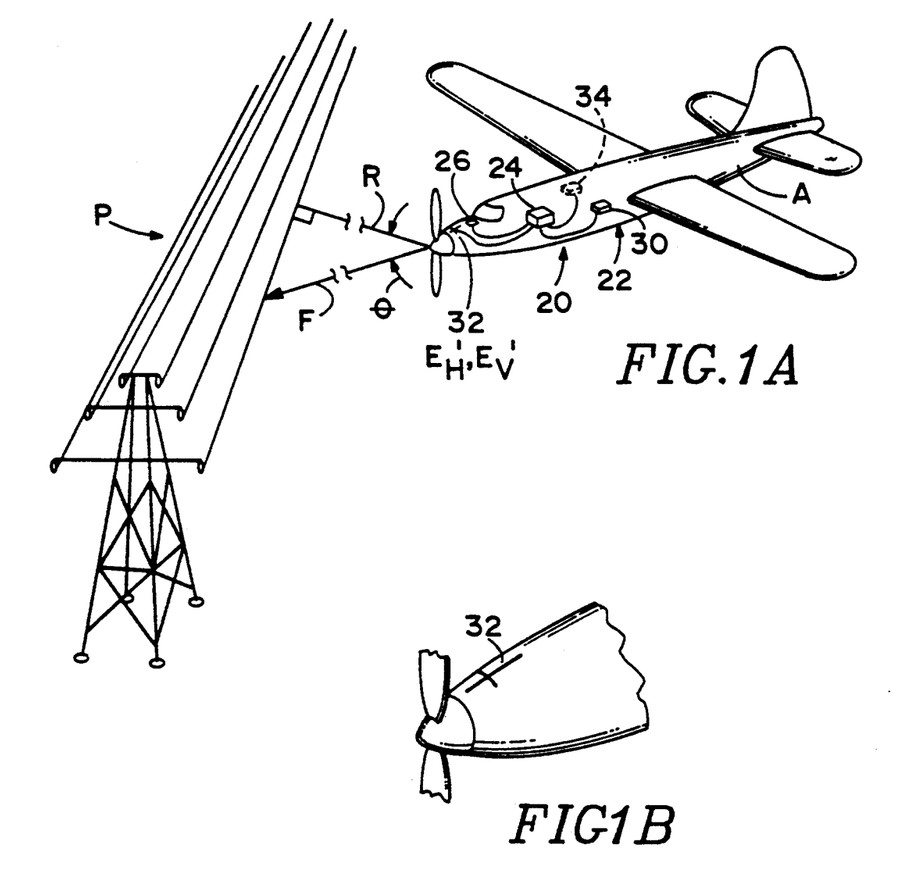

FIGS. 1A and 1B illustrates an on-board electric field detector system 20 for use on board an aircraft to detect an electrical power line P, having an electric field associated therewith.

Figure 2:
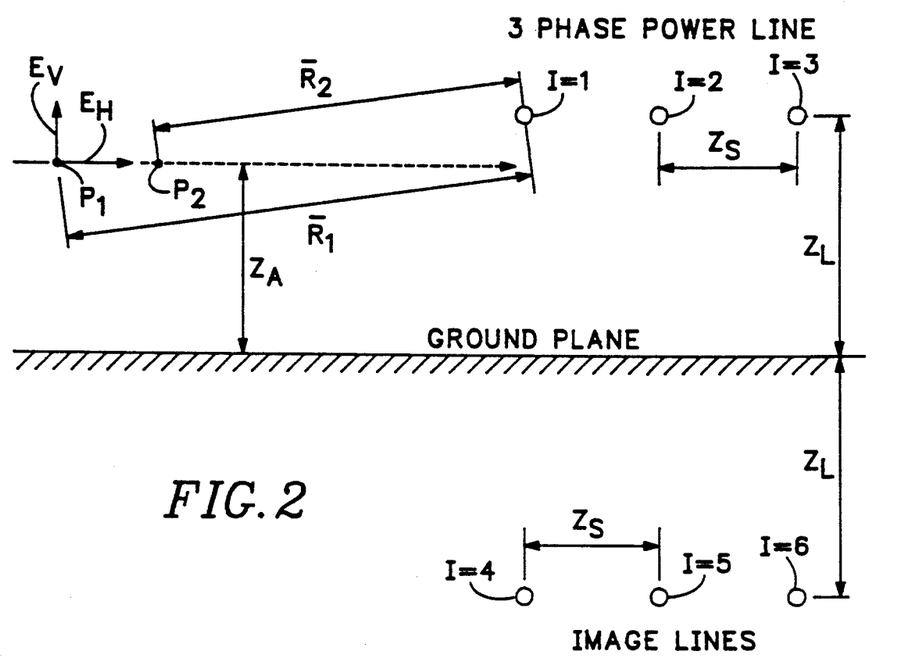

Before discussing the operation of the electric field detector, it will be useful to describe the theoretical background of the invention and some experimental observations. Referring to FIG. 2, the three phase power line P of FIG. 1A is modeled as a line comprising three spaced conductors labeled as I=1, I=2 and I=3. (The distance and direction of the sensor from the three phase power line is indicated as the vector quantity $\bar{R}$.) The conductors are spaced apart a distance $Z_S$ and located a linear distance $Z_L$ above an electrical ground plane which may be located near the earth's surface.

The voltage on the three phase power line is assumed to be sinusoidal, that is of the form $v_i = v_{max} \sin(\omega t + \phi_i)$, where the phase between the lines differs by $2\pi/3$. Although this analysis is for three phase lines, it is apparent that the method would be similar for single phase and two phase lines. The energized lines create images of themselves, indicated in FIG. 2 as image lines labeled I=4, I=5 and I=6. The image lines are spaced apart a distance $Z_S$ and located beneath the ground plane the same linear distance $Z_L$ as the real lines are above the ground plane. The polarity of the image lines is opposite to that of the real lines.

The electric field at a distance R from a single linear conductor can be computed from the following equation:

$$E = \frac{\rho}{2\pi\epsilon_o R}$$

where
 $\rho$ = the charge density,
 $\epsilon_o$ = the permittivity of free space, and
 R = the radial distance from the line to the sensor.
(Halliday and Resnick, "Physics", John Wiley & Sons, 675 (1966)) Without any loss of generality, relative field strengths may be calculated from the geometry of the model by summing the contributions of each conductor, inserting range values and setting the constants for a given power line, i.e. $\rho/(2\pi\epsilon_0)$, equal to one.

As mentioned earlier, the electric field $\overline{E}$ is directed radially away from the power line. The net electric field at any point of interest is the vector sum of the electric fields from the real three phase power line plus the electric fields from the three image conductors. The fields can be reduced to vertical and horizontal components relative to the earth's surface and the components summed to obtain the net electric field. The net horizontal component is generally different in magnitude from the net vertical component.

FIG. 2 illustrates the horizontal and vertical components $E_H$ and $E_V$ of the electric field $\overline{E}_1$, measured at a point $P_1$, which is a vertical distance $Z_A$ above the ground plane and a radial distance $R_1$ from the real power line conductor labeled $I=1$. For the real power line conductors, where I equals one, two or three, the total field may be computed as:

$$E_I = \frac{\sin(I \times 2\pi/3)}{[(R + (I-1)Z_S)^2 + (Z_A - Z_L)^2]^{\frac{1}{2}}} = \frac{\sin(I \times 2\pi/3)}{R_I'}.$$

From this, the vertical component may be expressed as:

$$E_{VI} = E_I \times (Z_A - Z_L)/R_I'.$$

And the horizontal component may be expressed as:

$$E_{HI} = E_I \times [R + (I-1)Z_S]/R_I'.$$

The total field for the image conductors located beneath the ground plane, where I equals four, five or six, may be expressed as:

$$E_I = \frac{-\sin[(I-3) \times 2\pi/3]}{[(R + (I-4)Z_S)^2 + (Z_A + Z_L)^2]^{\frac{1}{2}}} = \frac{-\sin[(I-3) \times 2\pi/3]}{R_I''}.$$

From this, the vertical component may be expressed as:

$$E_{VI} = E_I \times (Z_A + Z_L)/R_I''.$$

And the horizontal component may be expressed as:

$$E_{HI} = E_I \times [R + (I-4)Z_S]/R_I''.$$

From the above, the total horizontal and vertical fields are the summation of the respective horizontal and vertical contributions of the real conductors and the image conductors, that is from the variable I equals one through I equals six. Various range values were substituted into the above equations and the results are graphed in FIG. 3.

Figure 3:
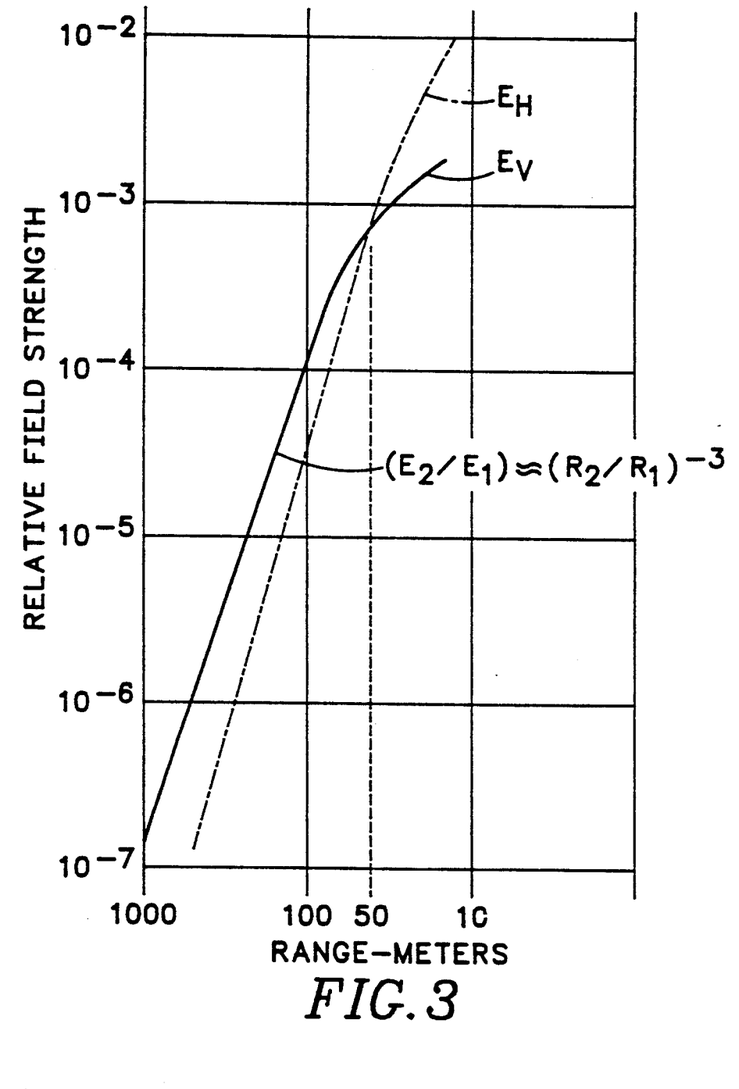

From evaluating the plots in FIG. 3 using a curve-fitting analysis, it was concluded that the electric field decreases as a high order function of distance, which in this case is approximately $1/R^3$ at large distances, such as greater than 100 meters. Thus, for large values of R the relationship between the electric field E and the distance R is given by $E = K/R^3$, where K is a proportionality constant. Differentiating and changing notation, $$\Delta E = -3E\Delta R/R$$

Referring again to FIG. 1A, detector 20 comprises sensor means 22 including on-board antenna means, such as antenna 32, for sensing the electric field produced by the electrical power lines P and for producing a electric field signal corresponding to the sensed electric field. Signal processing means 24 are provided for receiving and processing the electric field signal and for producing therefrom an output signal. The output signal is received by output means 26 for providing an output to an operator of the aircraft, such as an aircraft pilot or an autopilot control system, indicative of factors concerning the approach of the aircraft toward the power line P, such as the time-to-impact.

The antenna means may comprise one or more of a variety of different antenna arrangements capable of detecting an electric field. For example, an antenna means placed upon a vehicle having a nonconductive body, such as of fiberglass, may comprise metallic strips adhered to the body of the vehicle. In such applications, the antenna means may be mounted on either the interior or the exterior of the vehicle body. Dipole antennas projecting outwardly from the vehicle exterior may also be used.

For a vehicle having a body of an electrically conductive material, such as steel, aluminum or another metal, which acts as a shield to an electric field, antennas may be mounted to the exterior of the vehicle body. In this case, it is necessary to insulate the antenna from the body, for example by use of an electrically insulating mounting means.

The following nomenclature will be used in describing the signals generated by the illustrated embodiment of the emission source detector 20 of the present invention. The subscript letter "H" refers to a horizontal component of the electric field, while the subscript letter "V" refers to a vertical component of the electric field. The letter "E" is used to denote an electric field voltage signal which corresponds to the electric field. The prime symbol (') indicates a sensed voltage representing the composite electric field seen by an antenna means. A double prime symbol (") or an unprimed variable denotes a signal produced by the signal processing means.

One particularly useful antenna means comprises means for sensing two mutually perpendicular components of the electric field, such as the horizontal and vertical components, and producing two electric field signals in response thereto. For example, in FIG. 1A for aircraft A having a body of an electrically shielding material, such as aluminum, the sensor means 22 comprises the cross-polarized antenna 32, as shown in FIG. 1B, mounted to the exterior of the body by an electrically insulating means (not shown).

Electrical coupling means, such as a coaxial cable, interconnect the antenna 32 with the signal processing means 24. An electrical coupling means also interconnect the signal processing means 24 with the output means 26.

Figure 5:
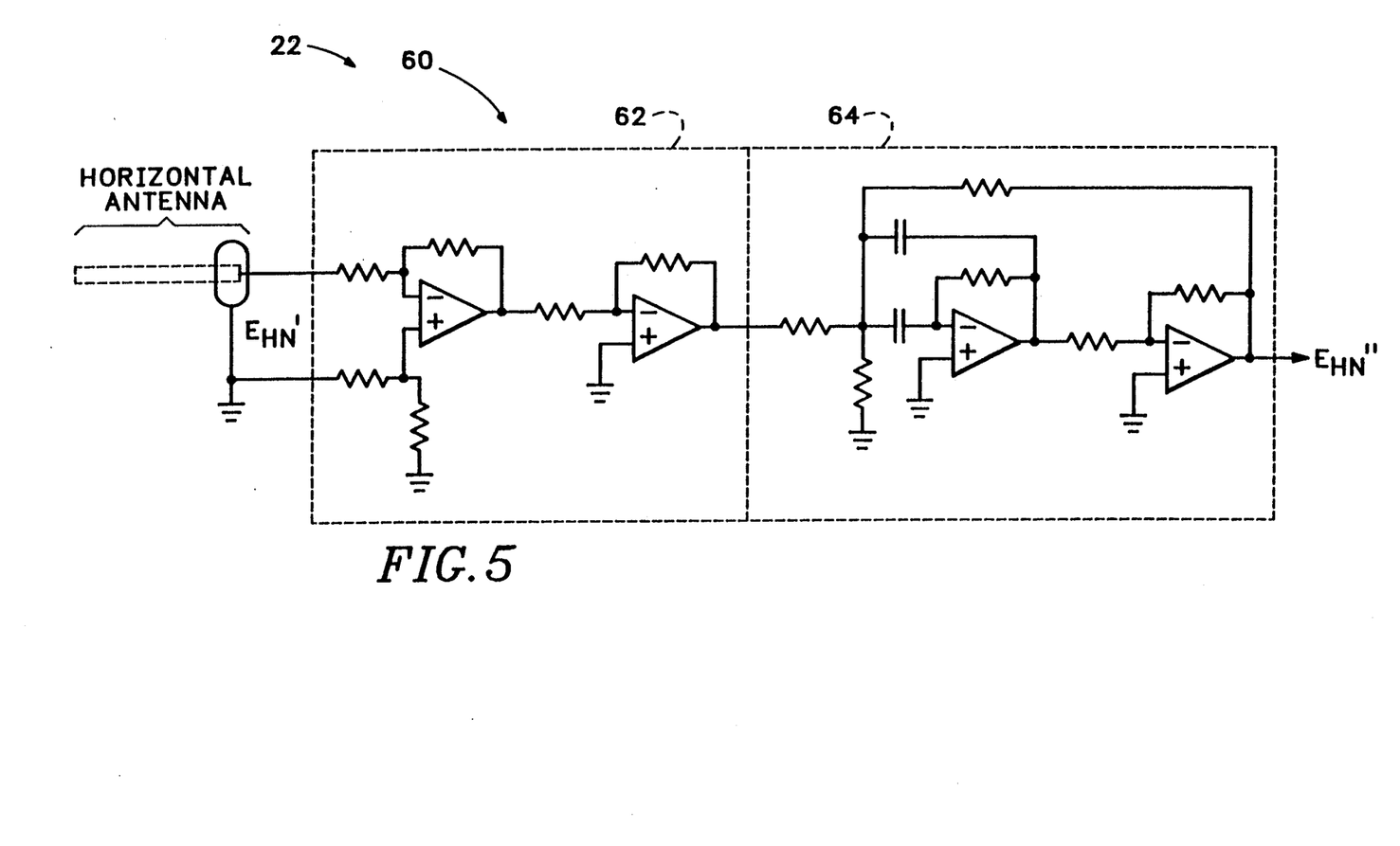
FIG. 5 is a circuit diagram of one form of a signal conditioning means that forms part of the on-board electric field detector.

FIG. 5 illustrates an additional portion of the sensor means 22 comprising signal conditioning means 60 for producing a conditioned electrical field signal output of $E_H''$ or $E_V''$ from the horizontal or vertical antenna signal $E_H'$ or $E_V'$. The signal conditioning means 60 have a high input impedance operational amplifier 62 which receives and amplifies an antenna signal, such as $E_H'$. The amplified antenna signal is filtered by a filter 64 to remove frequency components other than the power line frequency and to produce conditioned antenna signals $E_H''$.

Referring again to FIG. 2, if we assume that the aircraft is traveling at a constant ground speed towards the power line and passes the point $P_1$ at time $t_1$ and the point $P_2$ (which is at distance $R_2$ from the power line) at time $t_2$, then the time-to-impact T, measured from the time $t_2$, is equal to $R_2(t_2-t_1)/(R_1-R_2)$. If the points $P_1$ and $P_2$ are close together, so that $R_1-R_2$ is very much less than $R_1$ or $R_2$, the time-to-impact T can be expressed as $-R\Delta T/\Delta R$. Substituting $R/\Delta R$ from the expression for T into the expression for $$\Delta E = 3E\Delta T/T$$

, or $$T = 3E\Delta T/\Delta E$$

For points $P_1$ and $P_2$ that are close together, $E_H$ and $E_V$ are each linearly related to E. Therefore, $$T = 3E_H\Delta T/\Delta E_H$$

and $$T = 3E_V\Delta T/\Delta E_V$$

where $\Delta E_H$ is the difference between the values of the horizontal component $E_H$ of E at points $P_2$ and $P_1$ and $\Delta E_V$ is the difference between the values of the vertical component $E_V$ of E at points $P_2$ and $P_1$. Thus, if $\Delta T$ is known and either $E_H$ and $\Delta E_H$ are measured or $E_V$ and $\Delta E_V$ are measured, the value of T can be calculated. For example, the signal $E_H''$, which represents the horizontal component of $\overline{E}$, is sampled at predetermined intervals (10 ms, say) and two consecutive sample values of $E_H''$ are subtracted to return a value for $\Delta E_H$. Since the sampling interval (which is equal to $\Delta T$) is known, the value of T can then be calculated. Separate values of T may be calculated based on the horizontal and vertical field components respectively, to provide verification. The necessary calculation can be carried out using a general purpose digital computer, or a simple analog computer could be designed to solve the equation for T, given the values of $\Delta T$, E and $\Delta E$.

From the graphs, such as that shown in FIG. 3, it is apparent that a component electric field signal value may be compared with a reference value which is known and correlates a given component electric field signal with a range value. From the graph shown in FIG. 3, it is also apparent that the relative strength of the horizontal and vertical component curves approach one another as the aircraft A approaches the power line P. Thus, by comparing the ratio of the vertical to the horizontal electric field signals with a reference value, a range value can be determined.

From the graphs, it is apparent that the vertical component of the electric field is larger than the horizontal component until the moving vehicle reaches a certain distance from the line during approach. At distances closer than 100 meters or so, the slope of the vertical component curve begins to change, as does the slope of the horizontal component curve at a slightly closer distance to the power line. Due to these changing slopes, the calculations set forth above predict that the horizontal and vertical components of the electric field intersect at a range of approximately 50 meters. By detecting the cross-over point, a discrete warning can be given to the aircraft pilot that the power line is very close and that he should take steps to avoid impact with the power line.

Figure 4:
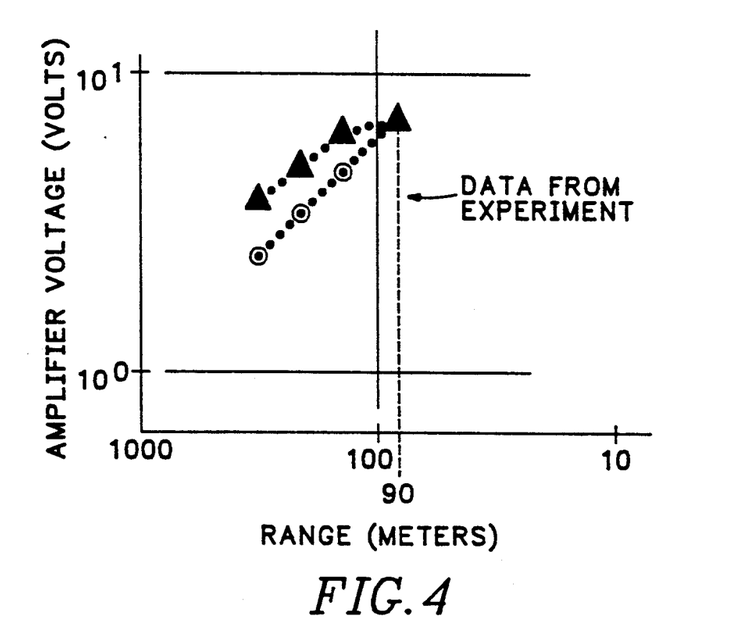

The existence of the curve cross-over phenomenon was confirmed by experiments conducted on electric fields emitted from a power transmission line and detected by a hand-held sensor. Readings were taken while moving the sensor along a ridge of land extending away from the power transmission line. The detector was a simple high input impedance amplifier having an output to a digital voltmeter. The sensor was a dipole antenna, which was held in horizontal and vertical orientations to detect the respective horizontal and vertical components of the electric field at various distances from the power transmission line. This experimental data is shown in FIG. 4, with the cross over of the horizontal and vertical components occurring at a range of approximately 90 meters from the power line. The vertical scale on the graph of FIG. 4 is in volts, as read from the digital voltmeter.

Depending upon the particular application, the sensor means 22 comprising the antenna means and the signal conditioning means 60 may be physically concentrated within one area of the aircraft or dispersed in several locations throughout the aircraft. For example, the signal conditioning means 60 may be physically located within the aircraft adjacent the signal processing means 24. Alternatively, the signal conditioning means 60 may be located near the antenna 32.

Although the expression for T has been derived on the assumption that the aircraft heading is directly towards the power line, the aircraft heading is not relevant to the time-to-impact calculation since the time-to-impact is dependent only on the range R and the component of the aircraft's ground velocity that is perpendicular to the path of the power line. However, the heading relative to the direction of the power line is important to a pilot determining in which direction to make a course correction. (In this specification, the term "direction of a power line," means the direction of the shortest line from the aircraft to the power line.) The direction of the power line relative to the aircraft heading may be determined by use of sensors 30 and 34. Sensors 30 and 34 are mounted at the left and right respectively of the aircraft.

Figure 7A:
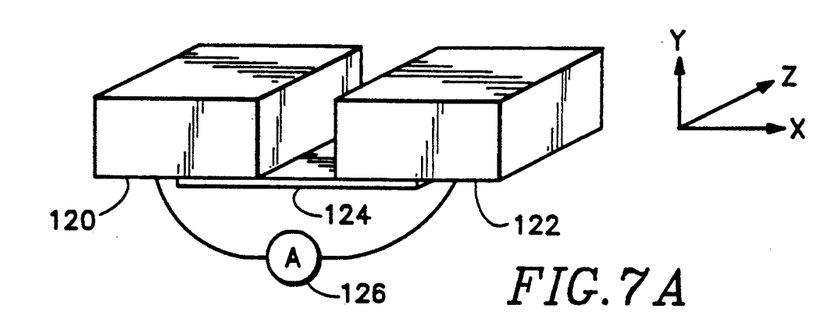
FIGS. 7A and 7B illustrate apparatus used to detect the electric field in the vicinity of an electric power line.

In order to aid in understanding the operation of the system including sensors 30, 34, reference is made to FIG. 7A, which shows two hollow, rectangular metal shells 120 and 122. Shells 120 and 122 are identical. The end faces of the shells are parallel and the shells are attached together by a plate 124 of electrically insulating material, such as the synthetic plastic material sold under the trademark DELRIN. The four side faces of shell 122 are coplanar with respective faces of shell 120. Referring to the coordinate axes shown in FIG. 7A, the X, Y and Z dimensions of each shell are about 12.5 cm, 5 cm and 18 cm respectively, and the shells are spaced apart in the X direction by about 6.4 cm. An ammeter 126 is connected to the two shells. Although the ammeter is shown outside the shells, this is purely for ease of illustration. In fact, the ammeter is inside one of the shells, so that it is shielded from external fields, and its display is observed through a small hole in a face of that shell. The apparatus shown in FIG. 7A is similar to apparatus currently used for detecting electric field in the vicinity of an electric power line.

The apparatus shown in FIG. 7A was supported above the ground in the vicinity of a three-phase, high voltage electric power line. The apparatus was supported at a height of about 4 m above the ground, in order to minimize ground plane effects. The shells were disposed with the XZ plane horizontal and the power line extending parallel to the Z axis and spaced from the shells along the X axis by a distance of about 50-100 m. The ammeter, which is of very low impedance, provides the only path for current to flow between the two shells and the charges on the two shells are redistributed through the ammeter. The ammeter provided a measurable current reading. The apparatus was then rotated through 180 degrees about a vertical axis, so that the positions of the shells relative to the power line were reversed, but the two shells stayed in the same positions relative to each other. The ammeter reading was found not to be significantly different from the previous ammeter reading.

Figure 7B:
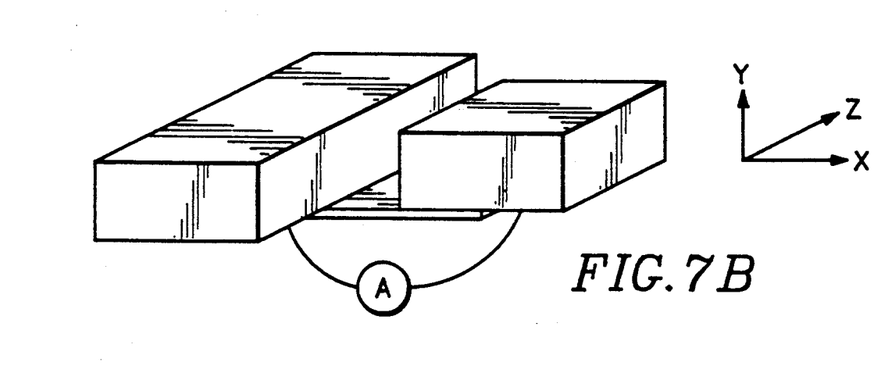

A similar experiment to that described with reference to FIG. 7A was conducted using the apparatus shown in FIG. 7B. The apparatus shown in FIG. 7B is the same as that shown in FIG. 7A, except that the Z dimension of one of the shells is about 36 cm instead of about 18 cm. It was found that when the smaller shell was closer to the power line, the ammeter reading was about twice that when the larger shell was closer to the power line.

Figure 8:
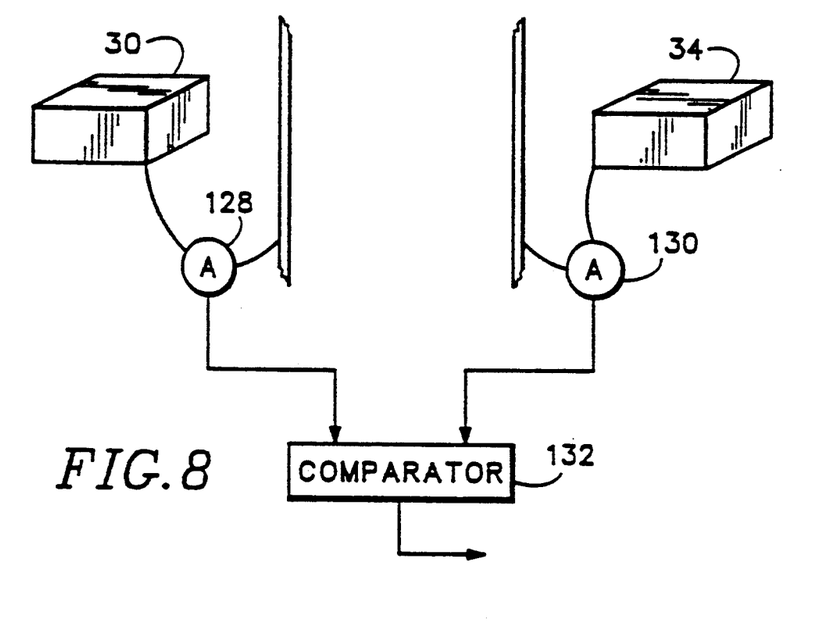
FIG. 8 shows a detail of FIG. 1A in order to illustrate how the direction of a power line can be determined.

Referring again to FIG. 1A, each of the sensors 30 and 34 is a rectangular shell. Sensors 30 and 34 are mounted to opposite respective sides of the central plane of the aircraft, i.e., the plane through the central axis of the aircraft and about which the aircraft is substantially symmetrical, with the YZ plane (FIG. 7A) parallel to the central plane of the aircraft. Sensors 30, 34 are mounted by use of insulating material and are electrically connected to the metal aircraft body through respective ammeters 128, 130 (FIG. 8). The metal aircraft body then functions as a large shell relative to the smaller shells of sensors 30, 34.

Based on the results of the experiments described with reference to FIGS. 7A and 7B, the current between sensor 30 and the aircraft body will be larger than the current between sensor 34 and the aircraft body if the direction of the power line is to the left of the aircraft, and vice versa when the direction of the power line is to the right of the aircraft. Ammeters 128, 130 generate voltage signals proportional to the respective current values, these signals are applied to a comparator 132 and the result of the comparison is used to indicate the direction of the power line.

Figure 6:
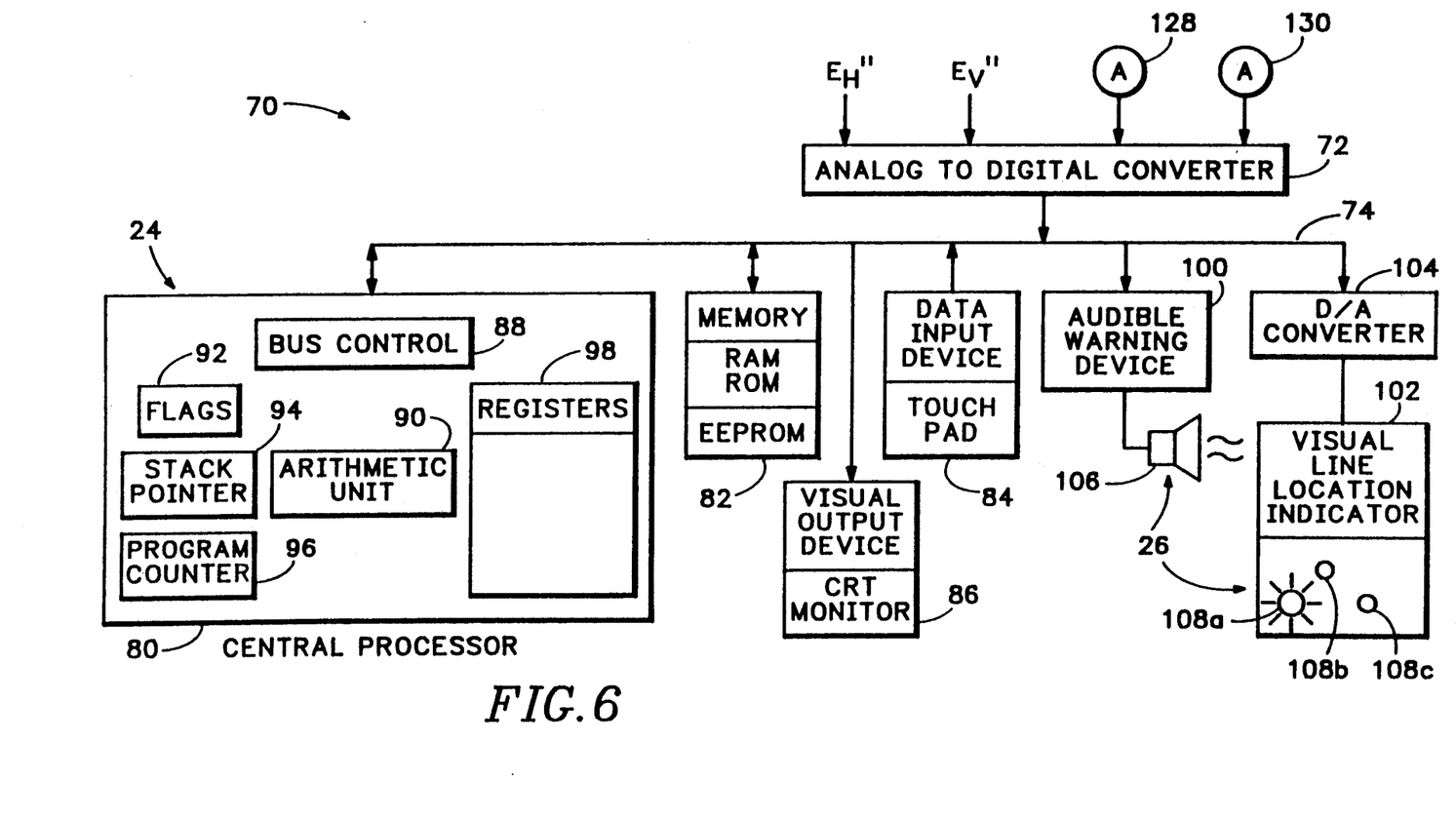
FIG. 6 is a block diagram of one form of a signal processing means and output means that form part of the on-board electric field detector.

Referring again to the arrangement described with reference to FIGS. 1A and 5, FIG. 6 illustrates hardware 70 used to process the conditioned antenna signals. The conditioned antenna signal outputs from filter 64 of the sensor means 22 are supplied as the conditioned analog E field sensor inputs to an analog-to-digital converter 72. The voltage signals representative of the currents measured by ammeters 128, 130 are applied to analog-to-digital converter 72 instead of to comparator 132. Converter 72 converts its input signals into digital signals which are supplied to a central bus 74.

The signal processing means 24 includes a central processor unit (CPU) 80, memory means 82 data input device such as a touch pad 84, and visual output device such as a CRT monitor 86. Each of the signal processing means components 80, 82, 84 and 86 communicates with the central bus 74.

The central processor unit 80 includes interacting bus control means 88, arithmetic means such as an arithmetic unit 90, flags 92, a stack pointer 94, a program counter 96, and storage registers 98. The memory means includes various memory units, such as random access memory (RAM), read-only memory (ROM), and electrically erasable and programmable read-only memory (EEPROM). The visual output device 86 and the data input device 84, such as a keyboard, may be of the type typically used with personal computers.

The output means 26 in communication with central bus 74 include an audible warning device 100 and a visual line location indicator 102, which communicates with central bus 74 through a digital-to-analog (D/A) converter 104. The audible warning device 100, which may include a speech synthesizer, provides an output to a loudspeaker or other electroacoustic transducer 106 to alert the pilot of an upcoming power line. The visual line indicator 102 provides an output to the pilot which indicates the direction of an upcoming power line relative to the aircraft heading. The visual line indicator may take on any form, such as three lights or light-emitting diodes (LEDs) 108. For example, for a power line detected to the left of aircraft A, light 108a turns on to indicate this, while lights 108b and 108c, indicating the respective front and right side directions, remain off (see FIG. 6). The visual output device 86 provides a legible readout of the result of the time-to-impact calculation.

It will be appreciated that there is a danger of a spurious indication of time-to-impact being given if the altitude of the aircraft is considerably greater than the height of the power line. This possibility may be guarded against by providing additional sensors, similar to sensors 30 and 34, on the top and bottom of the aircraft body: if the current between the aircraft body and the sensor on top of the aircraft body is substantially greater than that between the aircraft body and the sensor on the bottom of the aircraft body, it implies that the aircraft's altitude is such that it will not impact the power line. If the currents are substantially the same, the pilot should gain altitude.

It will be appreciated that it is not necessary to know the aircraft's ground speed in order to calculate the time-to-impact. This is a considerable advantage, because it is often difficult to obtain an accurate measure of ground speed. Slight variations in ground speed, for example due to gusts of wind, do not affect the accuracy of the calculation of the time-to-impact, because the samples of the electric field signal are taken at intervals that are much shorter than any short-term fluctuations in ground speed, and in any event the current value of the ground speed is implicitly used in calculating time-to-impact.

Figure 9:
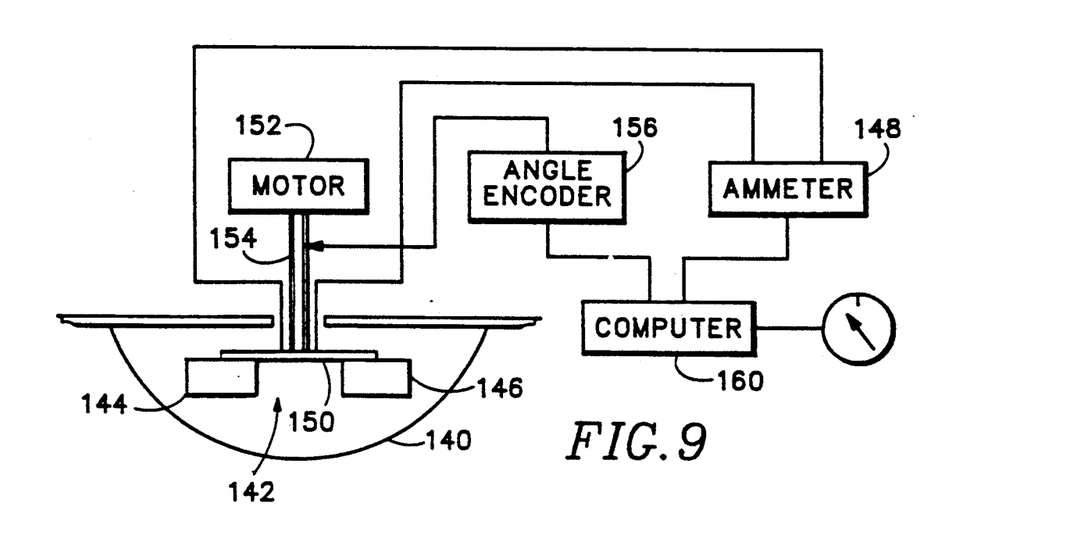
FIG. 9 illustrates how apparatus similar to that shown in FIG. 7B might be used on an aircraft to determine the direction of a power line relative to the heading of the aircraft.

FIG. 9 illustrates an aircraft having a bubble 140 of insulating material projecting beneath the aircraft body, which is typically metal. Inside the bubble 140 is apparatus 142 for detecting the direction of a power line. This apparatus is similar to the apparatus described with reference to FIG. 7B, and comprises two different-sized metal shells 144, 146 connected to an ammeter 148 and mounted on an insulating plate 150 so that the only current path between the shells is through the ammeter. The shells are supported so that they can be rotated continually relative to the aircraft about an axis perpendicular to the ends of the shells without changing the orientation of the shells relative to each other. This is accomplished by use of a motor 152 connected to plate 150 through a shaft 154. The shaft is provided with an angle encoder 156 which indicates the angular position of the shells relative to the central axis of the aircraft. Both the ammeter and the angle encoder are connected to a computer 160. When the aircraft is in the vicinity of a power line, and is at a height such that the horizontal component of the electric field from the power line induces charge on the shells, the current flowing through the ammeter will vary with a frequency equal to the rotational frequency of shaft 154. The computer detects the positive and negative peaks of the periodic variation in the current and relates it to the azimuth signal provided by the angle encoder. The computer then provides an output signal indicating the direction of the power line relative to the central axis of the aircraft so as to enable the pilot to change the heading of the aircraft in a manner that will avoid impact with the power line.

It will be appreciated that the present invention is not restricted to the embodiments that have been shown and described, and that variations may be made therein without departing from the scope of the invention as defined in the appended claims and equivalents thereof. For example, although the invention has been described with reference to voltage signals, current signals may also be used. Further, the invention is not applicable only to fixed wing aircraft but may be used with helicopters also. The fact that it is not necessary to measure ground speed is particularly important in the case of a helicopter, since a helicopter may have a very low air speed and a gust of wind might then have a large effect on the helicopter's ground speed. The cross-over phenomenon described with reference to FIGS. 3 and 4 is a useful safety measure for use with a helicopter, because a helicopter traveling at low speed towards a power line might have a long time to impact, yet still be dangerously close to the power line. The embodiment described with reference to FIG. 9 may be applied to a helicopter by mounting the sensors on the rotor tips.

We claim:

1. A detector for use on board a vehicle traveling along a path of movement to detect an object having an electric field associated therewith, comprising:
    a first antenna for sensing the horizontal component of the electric field associated with the object and producing a horizontal component electric field signal,
    a second antenna for sensing the vertical component of the electric field associated with the object and producing a vertical component electric field signal, and
    signal processing means for receiving at least one of said electric field signals and generating a time-to-impact signal representative of the time for the vehicle to reach the object if it continues on its path of movement.

2. A detector according to claim 1, wherein the signal processing means receive both the horizontal component electric field signal and the vertical component electric field signal and generate respective time-to-impact signals therefrom.

3. A detector according to claim 1, wherein the signal processing means receive both the horizontal component electric field signal and the vertical component electric field signal, compare the horizontal component electric field signal with the vertical component electric field signal, and provide a warning signal when the vertical component electric field signal is equal to or greater than the horizontal component electric field signal.

4. A detector for use on board an aircraft having first and second opposite sides and including conductive material between the first and second sides, to detect an object having an electric field associated therewith, said detector comprising:
    antenna means for sensing the electric field associated with the object and producing an electric field signal,
    signal processing means for receiving the electric field signal and generating a time-to-impact signal representative of the time for the aircraft to reach the object if it continues on its path of movement.
    a first conductive element at the first side of the aircraft,
    a second conductive element at the second side of the aircraft, and
    means for measuring current between said conductive material and the first and second conductive elements respectively and generating a signal representing the direction of the object from the aircraft.

5. A method for determining the direction of an electric field source relative to an aircraft's heading, comprising the steps of:
    (a) providing two dissimilar conductive elements aboard the aircraft at predetermined relative positions,
    (b) placing the conductive elements in a first orientation relative to the aircraft heading and in capacitively coupled relationship with the field source,
    (c) observing difference in charge induced on the conductive elements in said first orientation relative to the aircraft heading,
    (d), placing the conductive elements in a second orientation relative to the aircraft heading and in capacitively coupled relationship with the field source,
    (e) observing difference in charge induced on the conductive elements in said second orientation relative to the aircraft heading, and
    (f) comparing the difference observed in step (c) with the difference observed in step (e).

6. A detector for use on board a vehicle having first and second opposite sides and including conductive material between the first and second sides, to detect an object having an electric field associated therewith, said detector comprising:
    first antenna means at the first side of the vehicle for sensing the electric field and producing a first electric field signal,
    second antenna means at the second side of the vehicle for sensing the electric field and producing a second electric field signal, and
    signal processing means for receiving the electric field signals and generating a time-to-impact signal representative of the time for the vehicle to reach the object if it continues on its path of movement, and for comparing the first and second electric field signals and generating a signal representing the direction of the object from the vehicle.

7. A method for determining the direction of an electric field source relative to an aircraft's heading, comprising the steps of:
    (a) positioning two dissimilar conductive elements in capacitively coupled relationship with the field source and in a first orientation relative to the aircraft heading,
(b) observing the difference in charge induced on the two conductive elements in the first orientation,
(c) positioning the conductive elements in a second orientation relative to the aircraft heading without changing their positions relative to each other,
(d) observing the difference in charge induced on the two conductive elements in the second orientation, and
(e) comparing the difference observed in step (b) with the difference observed in step (d).

8. A detector for use on board an aircraft for detecting the direction of an electric field source, comprising:
two dissimilar conductive elements,
means for mounting the conductive elements aboard the aircraft so that the orientation of the conductive elements relative to the aircraft can be changed without changing the positions of the conductive elements relative to each other, and
means for observing the difference in charge induced on the conductive elements in at least two different orientations relative to the aircraft.

* * * * *